(12) United States Patent
Kim (10) Patent No.: US 10,347,863 B2
(45) Date of Patent: Jul. 9, 2019

(54) ORGANIC LIGHT-EMITTING DISPLAY DEVICE

(71) Applicant: LG Display Co., Ltd., Seoul (KR)

(72) Inventor: Do-Man Kim, Busan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/796,984

(22) Filed: Oct. 30, 2017

(65) Prior Publication Data

US 2018/0123084 A1 May 3, 2018

(30) Foreign Application Priority Data

Oct. 31, 2016 (KR) ........................ 10-2016-0143899

(51) Int. Cl.
*H01L 51/52* (2006.01)
*G06F 3/041* (2006.01)
(Continued)

(52) U.S. Cl.
CPC ........ *H01L 51/5246* (2013.01); *G06F 3/0412* (2013.01); *G09G 3/3208* (2013.01); *H01L 27/323* (2013.01); *H01L 27/3262* (2013.01); *G06F 2203/04103* (2013.01); *H01L 27/3276* (2013.01); *H01L 51/5203* (2013.01); *H01L 51/56* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 2014/0042398 A1* | 2/2014 | Choi | H01L 27/3244 257/40 |
| 2015/0311472 A1* | 10/2015 | Hong | H01L 51/5246 257/72 |
| 2017/0040569 A1* | 2/2017 | Watabe | H01L 27/3244 |

FOREIGN PATENT DOCUMENTS

| | | |
|---|---|---|
| CN | 102043297 A | 5/2011 |
| CN | 103151467 A | 6/2013 |

(Continued)

OTHER PUBLICATIONS

Office Action dated Aug. 23, 2018 with English translation issued in the corresponding Japanese Patent Application No. 2017-210204, pp. 1-10.

(Continued)

*Primary Examiner* — Kenneth B Lee, Jr.
(74) *Attorney, Agent, or Firm* — Polsinelli PC (57) ABSTRACT

Disclosed is an organic light-emitting display device capable of removing a void between a pad area and a display area. The display device having a display area and a non-display area includes a thin-film transistor array, an organic light-emitting array, a touch electrode array, and an adhesive layer between the touch electrode array and the organic light-emitting array. A lower pad portion having lower electrodes is provided in the non-display area of the thin-film transistor array, an upper pad portion having upper electrodes is provided in the non-display area of the touch electrode array, and both the pad portions are bonded to each other by a seal material having one side in contact with the adhesive layer. At least one groove is provided in the non-display area of the thin-film transistor array so as to correspond to the contact area of the seal material and the adhesive layer.

20 Claims, 8 Drawing Sheets

(51) Int. Cl.
*G09G 3/3208* (2016.01)
*H01L 27/32* (2006.01)
*H01L 51/56* (2006.01)

(56) References Cited

FOREIGN PATENT DOCUMENTS

| | | | |
|---|---|---|---|
| CN | 103681735 | A | 3/2014 |
| CN | 103904097 | A | 7/2014 |
| JP | 2007199341 | A | 8/2007 |
| JP | 2007234431 | A | 9/2007 |
| JP | 2007322627 | A | 12/2007 |
| JP | 2008009189 | A | 1/2008 |
| JP | 2010085803 | A | 4/2010 |
| JP | 2011209590 | A | 10/2011 |
| JP | 2013160836 | A | 8/2013 |
| JP | 2014039003 | A | 2/2014 |
| JP | 2015050245 | A | 3/2015 |
| JP | 2016051527 | A | 4/2016 |
| TW | 201407765 | A | 2/2014 |
| WO | 2011062009 | A1 | 5/2011 |
| WO | 2011129065 | A1 | 10/2011 |

OTHER PUBLICATIONS

Office Action dated Jul. 26, 2018 in a counterpart Taiwanese patent application No. 106137443.

* cited by examiner

ORGANIC LIGHT-EMITTING DISPLAY DEVICE

CROSS-REFERENCE TO RELATED APPLICATION

This application claims the benefit of Republic of Korea Patent Application No. 10-2016-0143899, filed on Oct. 31, 2016, which is hereby incorporated by reference in its entirety.

BACKGROUND

Field of the Disclosure

The present disclosure relates to a display device, and more particularly, to an organic light-emitting display device. Although the present disclosure is suitable for a wide scope of applications, it is particularly suitable for removing a void generated between a pad area and a display area of an organic light-emitting display device, during a bonding process of an organic light-emitting array and a touch electrode array in manufacturing an organic light-emitting display device.

Description of the Background

An image display device, which realizes various pieces of information on a screen, is a core technology of the information and communication age, and has been developed in the direction of becoming thinner, lighter, more portable, and having higher performance. As a flat panel display device that is capable of overcoming the problems of disadvantageous weight and volume of a cathode ray tube (CRT), for example, an organic light-emitting display device, which displays an image by controlling the intensity of luminescence of an organic emission layer, has been attracting attention.

Such an organic light-emitting display device displays an image using a plurality of pixels, which are arranged in a matrix form. Here, each pixel includes a light-emitting element and a pixel drive circuit having multiple transistors that implement independent driving of the light-emitting element.

Since the organic light-emitting display device described above uses a self-illuminating organic light-emitting element, and therefore does not require a separate light source and enables realization of a super-thin-type display device, in recent years, research on an organic light-emitting display device having an in-cell touch structure has actively been conducted, which uses an organic light-emitting element and includes a touch sensor inside a light-emitting cell.

In the organic light-emitting display device having an in-cell touch structure, an organic light-emitting array having an organic light-emitting element and a touch electrode array are disposed so as to be opposite each other and are bonded to each other by an adhesive layer. In addition, a pad portion of the touch electrode array is opposite to the pad portion side of an organic light-emitting display panel and is bonded thereto by an anisotropic conductive film (ACF) having a conductive ball.

In the bonding process of bonding the organic light-emitting array and the touch electrode array to each other, generally, the adhesive layer and the anisotropic conductive film are cured through a thermosetting process. However, as the organic light-emitting display device is increased in size, the thermosetting time for the bonding process is also increased.

With an increase in the time for which heat is applied in the bonding process, outgassing from, for example, the adhesive layer occurs. At this time, when the generated out-gas is trapped in the space between the anisotropic conductive film and the adhesive layer, a void can be formed between the adhesive layer and the anisotropic conductive film. Touch electrode array wires are located on the upper side of the area in which the void is generated, and the void can cause deterioration in the reliability of the touch electrode wires.

SUMMARY

Accordingly, the present disclosure is directed to an organic light-emitting display device that substantially obviates one or more problems due to limitations and disadvantages of the related art.

The present disclosure is to provide an organic light-emitting display device, which may remove a void generated between a pad area and a display area when an organic light-emitting array and a touch electrode array are bonded to each other.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, an organic light-emitting display device according to an aspect of the present disclosure is defined so as to be divided into a display area and a non-display area, and includes a thin-film transistor array, an organic light-emitting array, a touch electrode array, and an adhesive layer that bonds the touch electrode array and the organic light-emitting array so as to face each other.

A lower pad portion having a plurality of lower electrodes is provided in the non-display area of the thin-film transistor array, an upper pad portion having a plurality of upper electrodes is provided in the non-display area of the touch electrode array, the upper pad portion and the lower pad portion are bonded to each other by a seal material having a conductive ball, and one side of the seal material is in contact with the adhesive layer.

At least one groove is provided in the non-display area of the thin-film transistor array and is located in an area that corresponds to an area in which the seal material and the adhesive layer are in contact with each other.

The groove may be linearly provided so as to have a major axis in a horizontal direction, or may be provided so as to pass through the lower electrodes and extend to an outer periphery of the lower pad portion.

Meanwhile, the groove may also be provided in the touch electrode array. In this case, the groove is formed between a plurality of routing lines, which connect touch electrodes provided in the touch electrode array and the upper electrodes to each other, so as to correspond to the area in which the adhesive layer and the seal material are in contact with each other, and completely penetrates the touch electrode array so as to expose the adhesive layer and the pad portion to an outside.

It is to be understood that both the foregoing general description and the following detailed description of the present disclosure are exemplary and explanatory and are intended to provide further explanation of the disclosure as claimed.

BRIEF DESCRIPTION

The accompanying drawings, which are included to provide a further understanding of the present disclosure and are incorporated in and constitute a part of this disclosure, illustrate aspect(s) of the disclosure and together with the description serve to explain the principle of the disclosure.

In the drawings.

DETAILED DESCRIPTION

Hereinafter, exemplary aspects of the present disclosure will be described with reference to the accompanying drawings. Wherever possible, the same reference numbers will be used throughout the drawings to refer to the same or like parts. In addition, in the following description of the aspects, a detailed description of known functions and configurations incorporated herein will be omitted when it may make the subject matter of the present disclosure rather unclear. Also, the terms of constituent elements used in the following description are defined taking into consideration ease in the preparation of the specification, and may differ from the terms used to describe elements of actual products.

In the description related to a positional relationship, for example, when an element is referred to as being "on", "above", "under" and "aside" another element, it can be directly on the other element, or intervening elements may also be present.

It will be understood that although the terms first, second, third, etc., may be used herein to describe various elements, these elements should not be limited by these terms. These terms are only used to distinguish one element from another element. Thus, a first element discussed below could be termed a second element without departing from the teachings of example aspects.

In the drawings, the size and thickness of each constituent element are illustrated merely for convenience of description, and the present disclosure is not necessarily limited to the illustrated size and thickness of each constituent element.

Hereinafter, various aspects of the present disclosure will be described with reference to the accompanying drawings.

Figure 1:
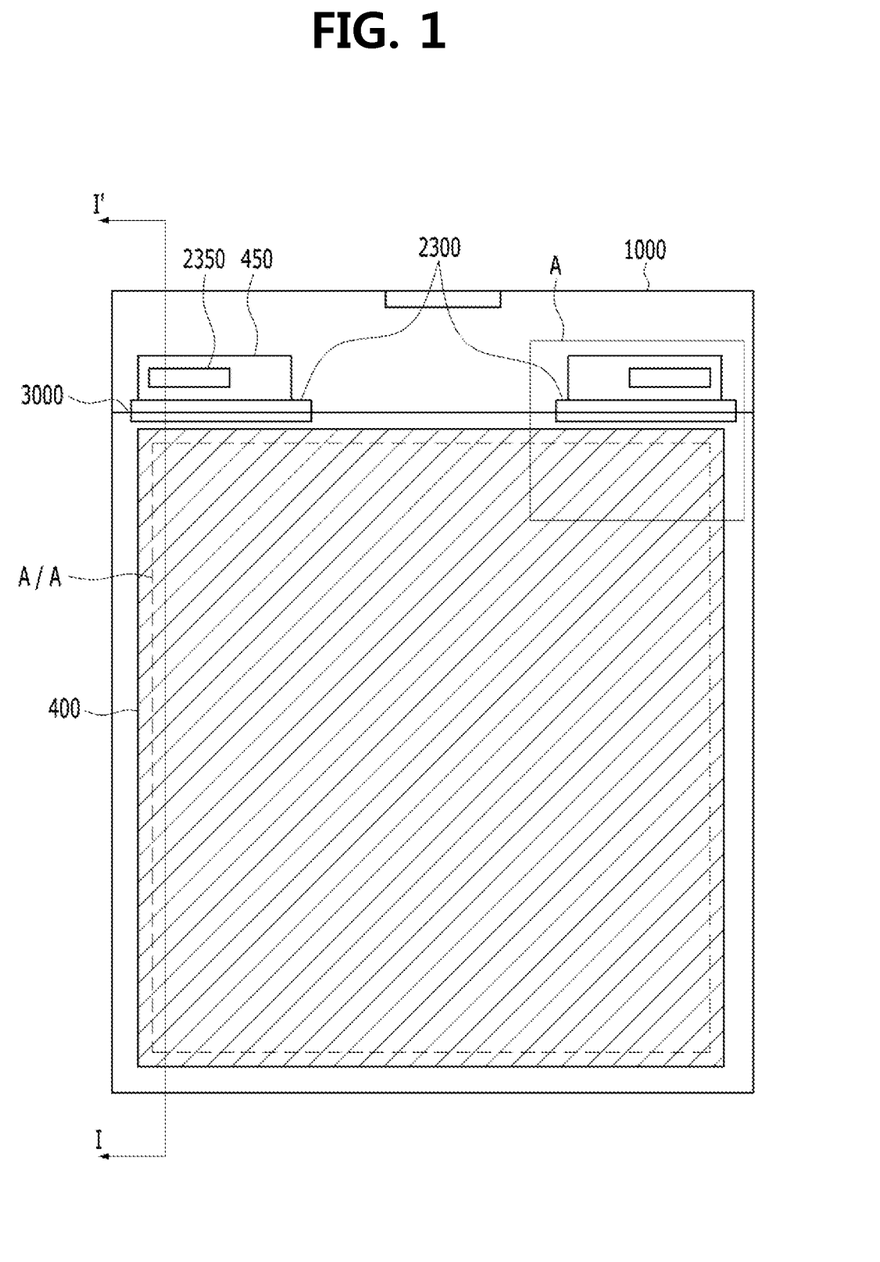
FIG. 1 is a schematic view illustrating an organic light-emitting display device according to an aspect of the present disclosure.
Figure 2:
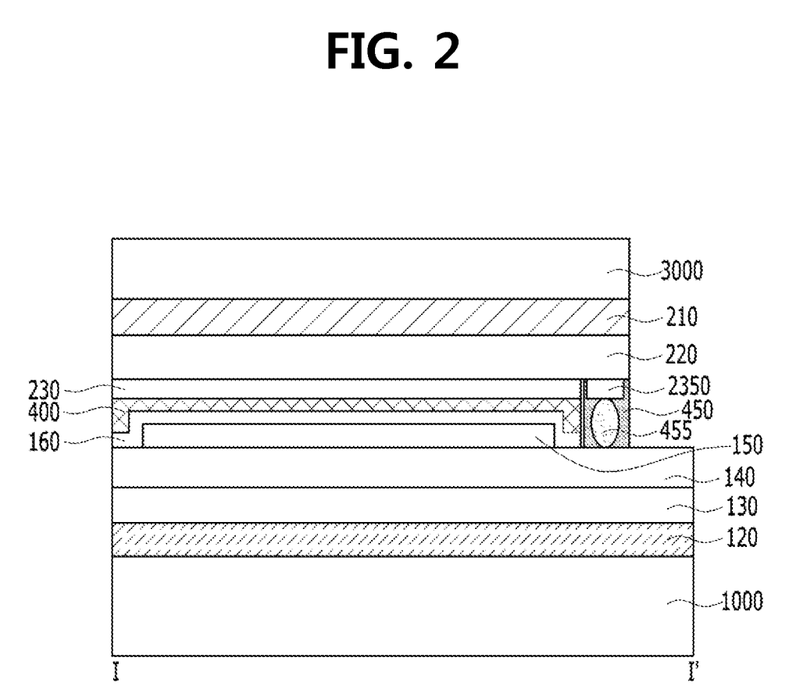
FIG. 2 is a cross-sectional view illustrating the cross-section taken along line I-I' of the organic light-emitting display device of FIG. 1.

FIG. 1 is a schematic view illustrating an organic light-emitting display device according to an aspect of the present disclosure, and FIG. 2 is a cross-sectional view illustrating the cross-section taken along line I-I' of the organic light-emitting display device of FIG. 1.

As illustrated in FIGS. 1 and 2, in the organic light-emitting display device of the aspect, an organic light-emitting array 150 and a touch electrode array 230 are formed respectively on the inner surfaces of a lower substrate 1000 and an upper substrate 3000 having different sizes, and are bonded to each other by an adhesive layer 400.

When forming these arrays, after each array is formed on the lower substrate 1000 or the upper substrate 3000, the upper substrate 3000 and the lower substrate 1000 may be removed by, for example, laser irradiation or etching. In this case, the lower substrate 1000 and the upper substrate 3000 illustrated in FIG. 2 may be omitted.

A first base 120, a first buffer layer 130, a thin-film transistor array 140, and the organic light-emitting array 150 are sequentially disposed on the lower substrate 1000, and a protective layer 160 is disposed so as to cover the organic light-emitting array 150. A second base 210, a second buffer layer 220, and the touch electrode array 230 may be disposed on the upper substrate 3000. Here, the touch electrode array 230 is located so as to face the organic light-emitting array 150. Here, the surface of the lower substrate 1000, which is kept in direct contact with the adhesive layer 400, is the protective layer 160, and the surface of the upper substrate 3000, which is kept in direct contact with the adhesive layer 400, is the touch electrode array 230.

In each of the first buffer layer 130 and the second buffer layer 220, a display area and a non-display area are defined. The touch electrode array 230, the organic light-emitting array 150, and thin-film transistors in the thin-film transistor array 140, excluding a lower pad portion thereof, are formed in the display area. In addition, an upper pad portion 2350 and the lower pad portion of the thin-film transistor array 140 are defined in a portion of the non-display area.

The first base 120 and the second base 210 may be provided in order to prevent damage to the inner arrays, excluding a glass material, of the upper substrate 3000 and the lower substrate 1000 during laser irradiation or etching. In some cases, the first base 120 and the second base 210 may be formed so as to have the features of a flexible substrate. In this case, the first and second bases 120 and 210 may substitute for the lower substrate 1000 and the upper substrate 3000. In this case, the lower substrate 1000 and the upper substrate 3000 may be removed. In addition, in some cases, the first and second bases 120 and 210 may be omitted. The first and second bases 120 and 210 may be formed of a polymer material such as, for example, polyimide and photoacryl.

In addition, each of the first buffer layer 130 and the second buffer layer 220 is formed by sequentially stacking the same kind of inorganic layers such as $SiO_2$ and $SiN_x$ one above another, or by alternately stacking different inorganic layers one above another. The first and second buffer layers 130 and 220 function as a barrier that prevents moisture or outside air from permeating the organic light-emitting array 150 in the subsequent process of bonding the upper substrate 3000 and the lower substrate 1000 to each other.

In addition, the upper pad portion 2350 is formed along with the touch electrode array 230.

The upper pad portion 2350 is connected to the lower pad portion of the thin-film transistor array 140 by a seal material 450 having a conductive ball 455, in a vertical bonding process using the adhesive layer 400. The adhesive layer 400 has a moisture permeation preventing function and is directly in contact with the protective layer 160, which covers the organic light-emitting array 150, thereby serving to prevent outside air from entering the organic light-emitting array 150 and to more reliably prevent the permeation of moisture, in addition to the function of the protective layer 160. In addition, the seal material 450 may be an anisotropic conductor film (ACF) having the conductive ball 455, without being necessarily limited thereto.

Here, the thin-film transistor array 140 including the lower pad portion may be configured so as to protrude from one side of the touch electrode array 230. An integrated circuit (IC) may be provided on the protruding portion of the thin-film transistor array 140 to transmit signals for driving the touch electrode array 230, the thin-film transistor array 140, and the organic light-emitting array 150.

Although not illustrated, a driving pad and a lower pad for the IC and the thin-film transistor array 140 include a plurality of lower electrodes and are connected to the IC via wires. In addition, after glass removal, the IC may be bonded to and connected to a flexible printed circuit board (FPCB) (not illustrated), thereby being controlled by a controller provided in the FPCB. The lower pad is formed with the same layer as the metal that forms a gate line or a data line in the area that corresponds to the upper pad portion 2350 among the non-display area around the display area.

The upper pad portion 2350 is formed on the second buffer layer 220, and is divided into two portions, which are formed on opposite peripheral positions of one side of the buffer layer 220 that is adjacent to the protruding portion of the lower substrate 1000. Among the divided upper pad portions 2350, one is divided into a plurality of touch pad electrodes for applying or detecting a voltage to first electrodes of the touch electrode array 230 in the X-direction, and the other one is divided into a plurality of touch pad electrodes for applying or detecting a voltage to second electrodes of the touch electrode array 230 in the Y-direction.

The conductive ball 455, which is connected to the upper pad portion 2350, is electrically connected to a dummy electrode (not illustrated), which is formed on the peripheral side of the thin-film transistor array 140.

The thin-film transistor array 140 includes at least one groove 2300 formed at a position that corresponds to the boundary between the adhesive layer 400 and the seal material 450. Although the groove 2300 is illustrated in FIG. 1 as being formed in the thin-film transistor array 140, for convenience, the groove 2300 in the thin-film transistor array 140 is illustrated so that the shape thereof is visible when viewed from the side of the upper substrate 3000.

Figure 3:
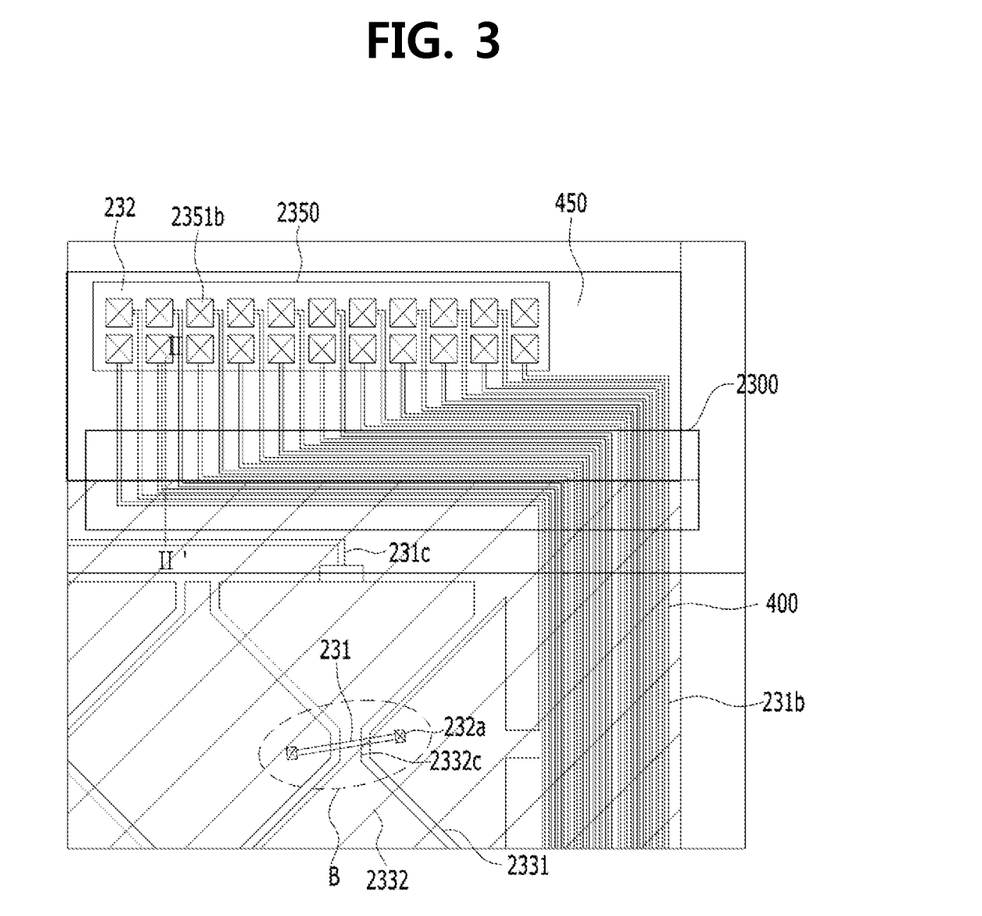
FIG. 3 is a schematic enlarged view of portion A of FIG. 1 according to an aspect of the present disclosure.

FIG. 3 is a schematic enlarged view of portion A of FIG. 1 to illustrate the position at which the groove 2300 is formed and the shape of the groove 2300 according to an aspect of the present disclosure.

As illustrated in FIG. 3, the touch electrode array 230 according to the present disclosure includes first and second touch electrodes 2331 and 2332, which cross each other, and upper electrodes 2351*b*, which transmit signals to the first and second touch electrodes 2331 and 2332, respectively. The upper electrodes 2351*b* are formed on the upper pad portion 2350. The upper electrodes 2351*b* may be connected to lower electrodes, which are formed in the lower pad portion of the thin-film transistor array 140.

Here, the first touch electrode may include first electrode patterns 2331, which have the shape of islands that are physically spaced apart from each other in a first direction, and metal bridges 231, each of which electrically interconnects the neighboring first electrode patterns 2331. The second touch electrode may include second electrode patterns 2332, which have the same shape as the first electrode patterns 2331 and are disposed in a direction that crosses the first direction, and connection patterns 2332*c*, each of which integrally interconnects the neighboring second electrode patterns 2332.

Routing lines 231*b* and 231*c* are provided outside the display area A/A in the Y-direction to connect the touch electrodes provided in the touch electrode array 230 and the upper pad portion 2350 to each other.

Referring to FIG. 3, the groove 2300 is formed in an area that corresponds to the boundary between the adhesive layer 400 and the seal material 450. The groove 2300 at least overlaps the boundary. In an aspect of the present disclosure, the groove 2300 is linearly formed so as to have the major axis thereof in the horizontal direction. Here, the groove 2300 is formed so as to extend to the outer periphery of the seal material 450. In this case, the length of the major axis of the groove 2300 may be equal to or greater than the horizontal width of the area in which the seal material 450 is formed. Thereby, the groove 2300 may extend from the boundary between the seal material 450 and the adhesive layer 400 to the side surface of the display panel, i.e. on the portion in which the seal material 450 and the adhesive layer 400 are not located. Meanwhile, the groove 2300 may extend to the vicinity of the edges of the seal material 450 and the adhesive layer 400 so that one end of the groove 2300 is covered with the seal material 450 and the adhesive layer 400.

Figure 4:
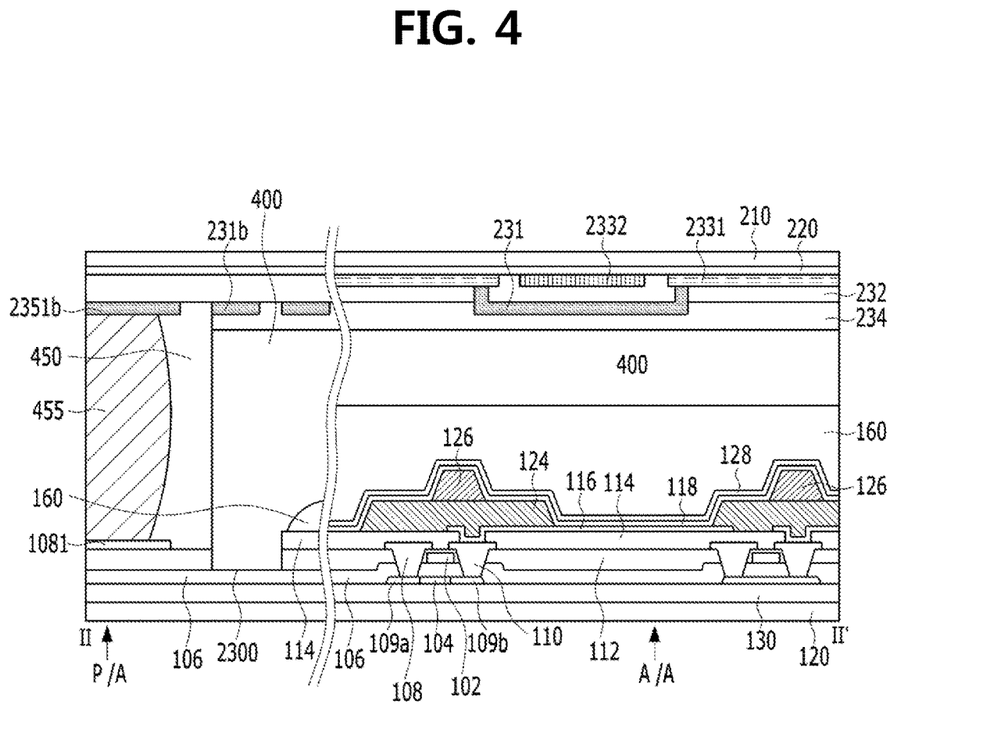
FIG. 4 is a schematic view illustrating the cross-section taken along line II-II' and area B of FIG. 3.

FIG. 4 is a schematic view illustrating the cross-section taken along line II-II' and area B of FIG. 3.

Referring to FIG. 4 illustrating the cross-section, designated by reference character B of FIG. 3, of the organic light-emitting display device according to the present disclosure, the thin-film transistor array 140, which is disposed on the first buffer layer 130 in the display area A/A, includes a plurality of thin-film transistors. Explaining the thin-film transistor array 140 in more detail, the thin-film transistor array 140 includes an active layer 104 having a source area 109*a* and a drain area 109*b*, a gate insulation layer 106 disposed on the active layer 104, a gate electrode 102 disposed on the gate insulation layer 106, an interlayer insulation layer 112 disposed to cover the gate electrode 102, contact holes formed by patterning the interlayer insulation layer 112 and the gate insulation layer 106 so as to expose the source and drain areas 109*a* and 109*b*, and a source electrode 108 and a drain electrode 110 connected respectively to the source and drain areas 109*a* and 109*b*. The source electrode 108 and the drain electrode 110 are covered with a lower passivation layer 114.

Although each of the interlayer insulation layer 112 and the lower passivation layer 114 is illustrated as being a single layer, in some cases, they may be respectively formed into two or more layers each.

The organic light-emitting array 150 is disposed on the thin-film transistor array 140. Explaining this in more detail, the organic light-emitting array 150 includes a first electrode 116 connected to the drain electrode 110 through a contact hole, which is formed by patterning the lower passivation layer 114 so as to expose the drain electrode 110, a bank insulation layer 124 disposed on the first electrode 116 and the lower passivation layer 114 so as to define each pixel opening, a spacer 126 disposed on the bank insulation layer 124, an organic layer 118 including an emission layer disposed on the first electrode 116, and a second electrode 128 disposed on the organic layer 118. In addition, as described above, the organic light-emitting array 150 is sealed by the protective layer 160.

The touch electrode array 230 may be configured such that the first and second touch electrodes are formed on the second buffer layer 220, a first upper passivation layer 232 is formed thereon and has a contact hole configured to expose a portion of the first touch electrode, the bridge 231 is formed through the contact hole so as to interconnect the neighboring first electrode patterns 2331, and a second upper passivation layer 234 is formed thereon, without being necessarily limited thereto. The touch electrode array 230 formed as described above is configured such that the touch electrode array 230 and the protective layer 160 face each other and the touch electrode array 230 is bonded to the protective layer 160 via the adhesive layer 400. Thereby, in the actual display device, the touch electrode array 230 described above has a vertically inverted structure.

A lower electrode 1081 is formed on the first buffer layer 130 in a pad area P/A. The lower electrode 1081 may be formed on the interlayer insulation layer 112 and a portion of the lower passivation layer 114 may be removed so as to expose the lower electrode 1081, without being necessarily limited thereto. The lower electrode 1081 may be formed using the same material as the gate electrode 102, simultaneously with the formation of the gate electrode 102, or may be formed using the same material as the source and drain electrodes 108 and 110, simultaneously with the formation of the source and drain electrodes 108 and 110.

An upper electrode 2351$b$ is formed on the second buffer layer 220 in the pad area P/A. The upper electrode 2351$b$ may be formed on the first upper passivation layer 232 and a portion of the second upper passivation layer 234 that is disposed on the upper electrode 2351$b$ may be removed so as to expose the upper electrode 2351$b$, without being necessarily limited thereto. Meanwhile, since the upper electrode 2351$b$ also has a vertically inverted structure, in the bonded structure, the upper electrode 2351$b$ is located below the first upper passivation layer 232. Thereby, the second upper passivation layer 234 is located below the upper electrode 2351$b$ and a portion of the second upper passivation layer 234 is removed so as to expose the upper electrode 2351$b$.

The lower electrode 1081 and the upper electrode 2351$b$ are electrically connected to each other by the seal material 450 having the conductive ball 455. The upper electrode 2351$b$ serves to supply a touch signal from the lower electrode 1081 to the touch electrodes 2331 and 2332 via the routing lines 231$b$ and 231$c$. Here, the routing lines 231$b$ and 231$c$, and the touch electrodes 2331 and 2332 may be formed in different layers and may be electrically connected to each other via contact holes, without being necessarily limited thereto.

The groove 2300 is located in the thin-film transistor array 140 so as to correspond to the area between the display area A/A and the pad area P/A, in which the adhesive layer 400 and the seal material 450 are in contact with each other. Here, the groove 2300 may be formed by removing at least one layer selected from among the first buffer layer 130, the gate insulation layer 106, the interlayer insulation layer 112, which includes at least one layer, and the lower passivation layer 114. The groove 2300 may function to trap air bubbles due to the out-gas, which can be generated when the adhesive layer 400 and the seal material 450 are bonded to each other, or may function, in particular, as a passage that discharges the out-gas to the outside of the adhesive layer 400 and the seal material 450 when the adhesive layer 400 and the seal material 450 are bonded to each other. Thereby, since the out-gas generated from, for example, the adhesive layer 400 is discharged outward through the groove 2300, the boundary between the adhesive layer 400 and the seal material 450 is completely filled with the adhesive layer 400, and no voids are generated. Here, since the routing lines 231$b$ are located on the boundary between the adhesive layer 400 and the seal material 450 and the bottoms of the routing lines 231$b$ are supported by the adhesive layer 400, which is filled without voids, the disconnection fault of the routing lines 231$b$ can be prevented, and the reliability of the organic light-emitting display device can be improved.

The groove 2300 may extend to the area in which the adhesive layer 400 is not located, thereby completely discharging the out-gas to the outside. Here, at least one end of the groove 2300 may protrude to the outside of the area in which the adhesive layer 400 and the seal material 450 are formed. Thereby, the groove 2300 may outwardly discharge the out-gas generated during the bonding process and can prevent the generation of voids.

In addition, the groove 2300 may extend to a position that corresponds to the area of the adhesive layer 400 in which wires such as, for example, the routing lines 231$b$ are not disposed so that at least one end of the groove 2300 is covered with the adhesive layer 400 and the seal material 450, and the out-gas may gather in a given area in which voids may be generated.

Meanwhile, the groove 2300 may completely penetrate, for example, the thin-film transistor array 140, the first buffer layer 130 and the first base 120 so as to expose the adhesive layer 400 to the outside. Since the permeation of outside air and moisture to the organic light-emitting array 150 is blocked by the protective layer 160, the organic light-emitting array 150 is protected even if the adhesive layer 400 is exposed. In addition, the out-gas, which is generated from the adhesive layer 400 and the seal material 450 when the organic light-emitting array 150 and the touch electrode array 230 are bonded to each other, may be discharged outward through the groove 2300.

Figure 5:
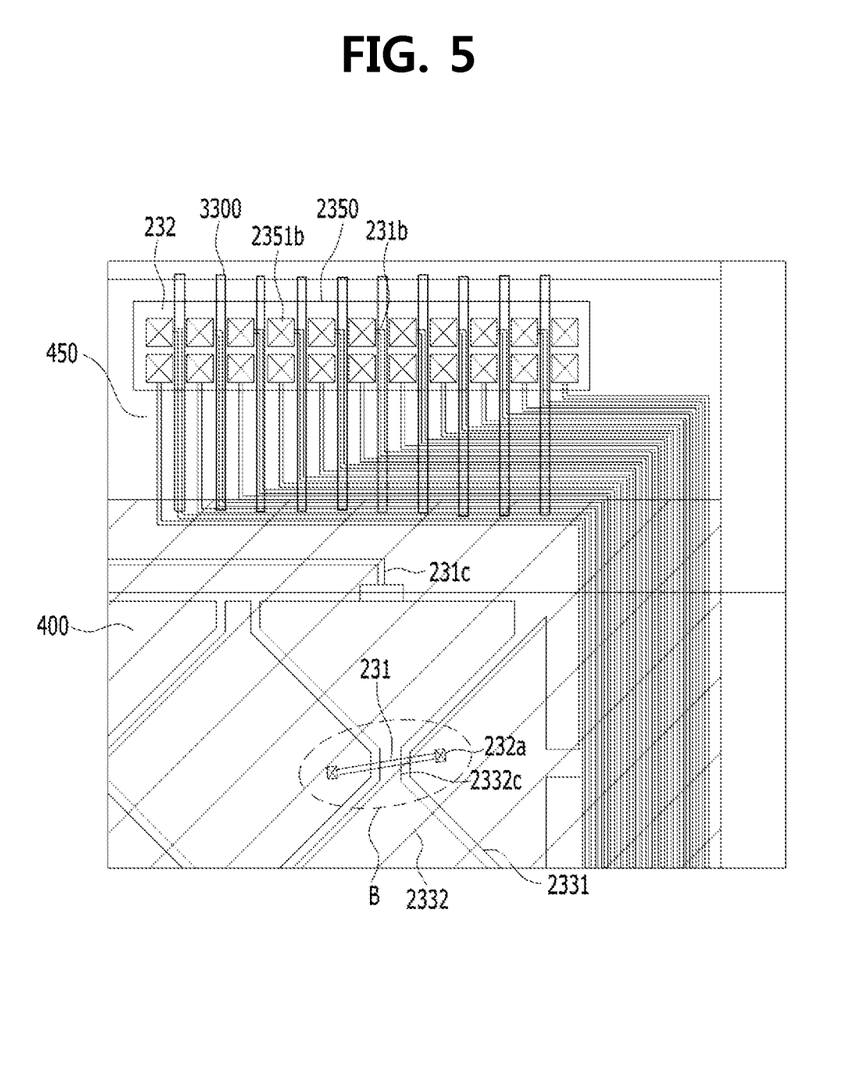
FIG. 5 is a schematic view illustrating a groove according to another aspect of the present disclosure.

FIG. 5 is a schematic view illustrating a groove 3300 according to another aspect of the present disclosure.

The groove 3300 is formed in an area that corresponds to the boundary between the adhesive layer 400 and the seal material 450. The groove 3300 at least overlaps the boundary. The groove 3300 according to the second aspect of the present disclosure extends from a position that corresponds to the area in which the adhesive layer 400 and the seal material 450 are in contact with each other in the Y-direction, i.e. toward the lower pad electrodes 1081. In addition, the groove 3300 extends through the area between the neighboring lower pad electrodes 1081 to the outer periphery of the lower pad portion, and penetrates the lower pad electrodes 1081 when viewing the display panel from the front side. Thereby, one end of the groove 3300 may be located so as to correspond to the area in which the adhesive layer 400 and the seal material 450 are in contact with each other and the other end of the groove 3300 may penetrate the lower pad portion so as to extend to an area that corresponds to the outer periphery of the seal material 450. Here, the groove 3300 may be covered with the seal material 450. Thereby, the out-gas, which is discharged through the groove 3300 when the organic light-emitting array 150 and the touch electrode array 230 are bonded to each other, may gather in the area of the seal material 450, in which, for example, wires are not located, thereby forming voids, which may minimize the effect of voids.

In addition, a portion of the groove 3300 may protrude to the outer periphery of the seal material 450. Thereby, the out-gas may be completely discharged to the outside of the display panel through the groove 3300, thereby preventing the generation of voids.

Figure 6:
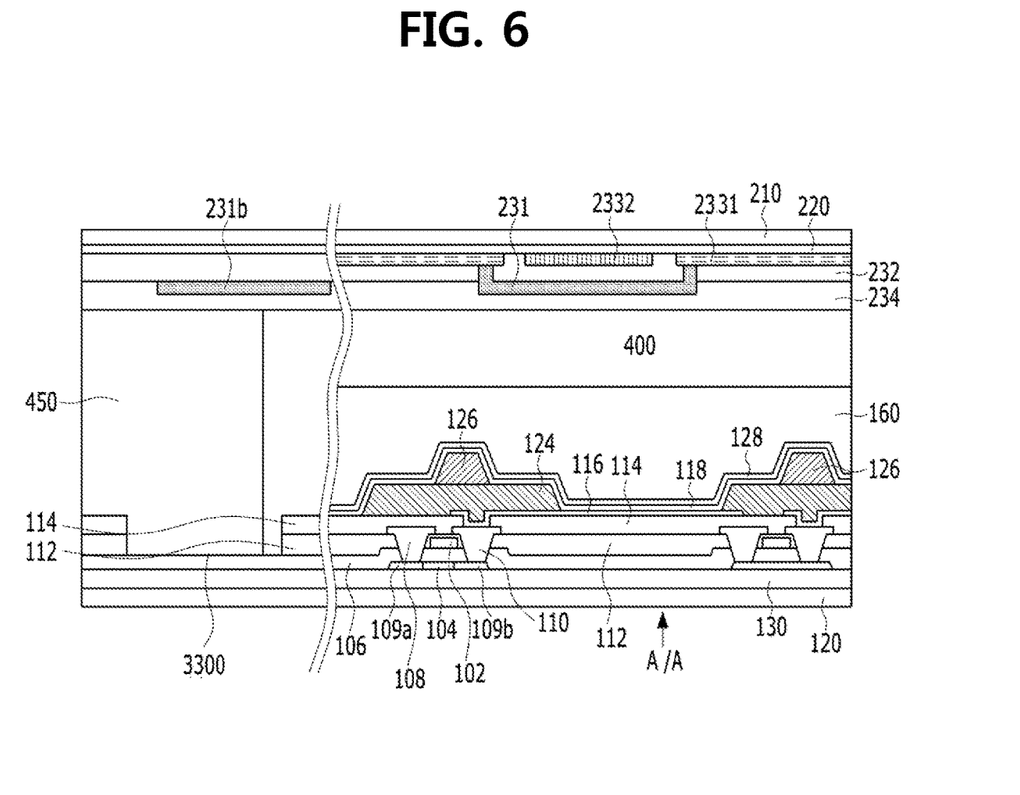
FIG. 6 is a schematic view illustrating the cross-section taken by vertically cutting the area in which the groove of FIG. 5 is formed.

FIG. 6 is a cross-sectional view illustrating the cross section taken by vertically cutting the area in which the groove 3300 of FIG. 5 is formed. The display area A/A is the same as that described above with reference to FIG. 4, and a detailed description thereof will be omitted.

The groove 3300 according to another aspect is also formed by removing a portion of at least one layer selected from among the first buffer layer 130, the gate insulation layer 106, the passivation layer 114 and the interlayer insulation layer 112, which includes at least one layer. Meanwhile, when the groove 3300 may be formed by removing a portion of the first buffer layer 130 and the first base 120 in the same manner as the previous aspect, the groove 3300 may be formed so as to penetrate the lower substrate 1000, and may consequently expose the adhesive layer 400 and the seal material 450 to the outside. When the groove 3300 penetrates the first buffer layer 130 and the first base 120, the out-gas generated from the adhesive layer 400 and the seal material 450 may be directly discharged to the outside of the display panel through the groove 3300.

Figure 7:
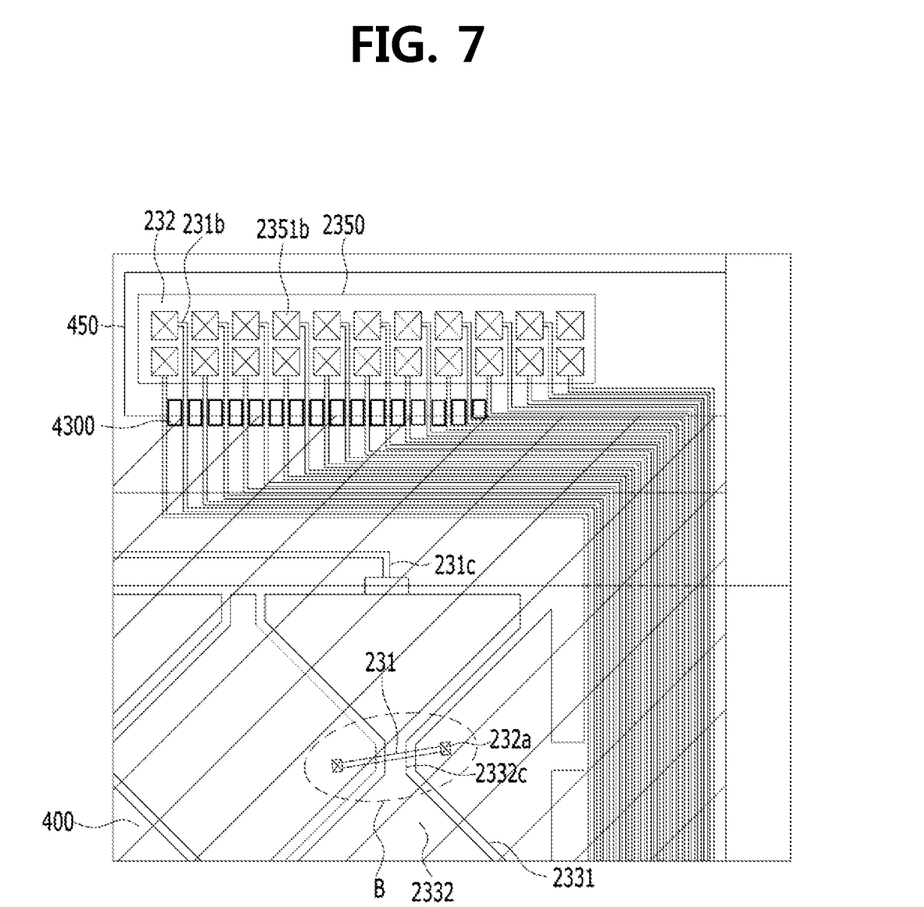
FIG. 7 is a schematic view illustrating a groove according to still another aspect of the present disclosure.
Figure 8:
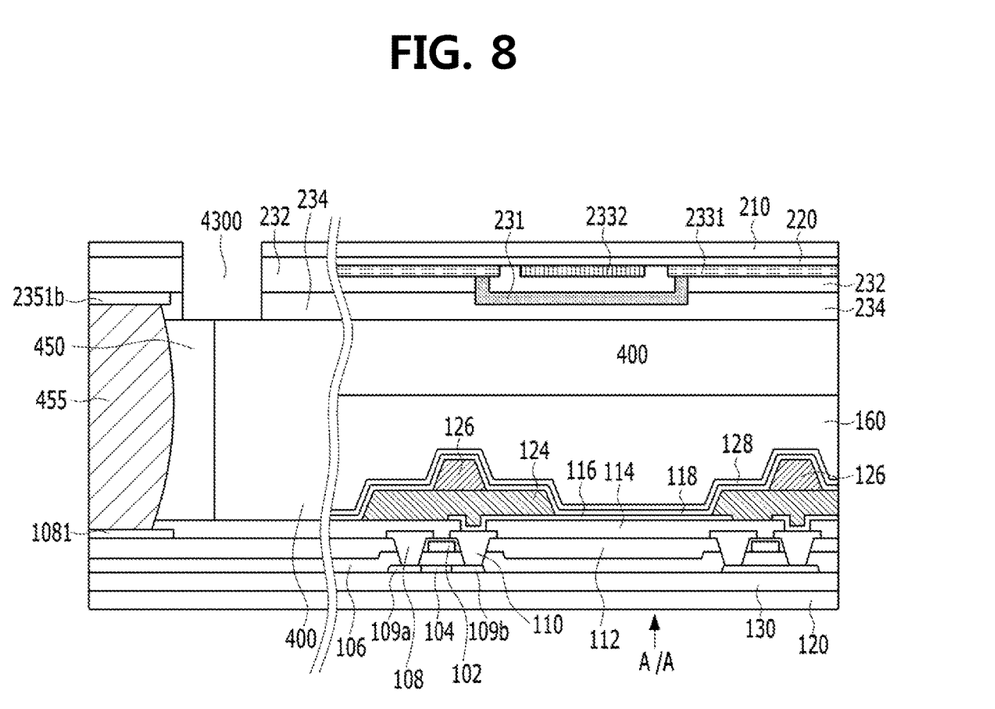
FIG. 8 is a cross-sectional view illustrating the portion in which the groove is formed and area B of FIG. 7.

FIG. 7 is a schematic view illustrating a groove 4300 according to still another aspect of the present disclosure, and FIG. 8 is a cross-sectional view illustrating the portion in which the groove 4300 is formed and area B of FIG. 7. The display area A/A has the same configuration as the above description of the previously disclosed aspects, and a detailed description thereof will be omitted.

The groove 4300 according to yet another aspect is formed in the touch electrode array 230, i.e. in the upper substrate 3000. The groove 4300 is formed in an area that corresponds to the boundary between the adhesive layer 400 and the seal material 450. The groove 4300 at least overlaps the boundary. Here, each groove 4300 is formed between the routing lines 231b in an area that corresponds to the area in which the seal material 450 and the adhesive layer 400 are in contact with each other. In addition, referring to FIG. 8, the groove 4300 penetrates the touch electrode array 230, the second buffer layer 220, and the second base 210 so as to expose the adhesive layer 400 and the seal material 450 to the outside.

When the groove 4300 is formed in the area in which the touch electrode array 230 is formed, the formation of the groove 4300 is limited due to the presence of the upper pad portion 2350 and the routing lines 231b located therearound. Accordingly, when the groove 4300 is formed in the area in which the touch electrode array 230 is formed, the relationship with the routing lines 231b may need to be considered in order to form the groove 430 in the space between the routing lines 231b.

In this case, since the space required to allow the groove 4300 to extend to the outside of the upper pad portion 2350 is insufficient, the groove 4300 is formed to penetrate the upper substrate 3000 when the first and second upper passivation layers 232 and 234, the second buffer layer 220, the second base 210 and the upper substrate 3000 are provided. Accordingly, the groove 4300 may expose the adhesive layer 400 and the seal material 450 to the outside, and the out-gas, which is generated when the touch electrode array 230 and the organic light-emitting array 150 are bonded to each other, may be discharged outward through the groove 4300.

In this way, the gap between the pad area P/A and the display area A/A may be filled with the adhesive layer 400 and the seal material 450 without voids, which can prevent the disconnection fault of the routing lines 231b and 231c and can increase the reliability of the organic light-emitting display device.

As is apparent from the above description, a groove according to various aspects of the present disclosure may function to trap air bubbles due to out-gas, which is generated when an adhesive layer and a seal material are bonded to each other, or may function as a passage that discharges the out-gas to the outside of the adhesive layer and the seal material when the adhesive layer and the seal material are bonded to each other. Thereby, since the out-gas generated from, for example, the adhesive layer is discharged outward through the groove, the boundary between the adhesive layer and the seal material is completely filled with the adhesive layer, and no voids are generated. Here, since routing lines are located on the boundary between the adhesive layer and the seal material and the bottoms of the routing lines are supported by the adhesive layer, which is filled without voids, the disconnection fault of the routing lines may be prevented, and the reliability of the organic light-emitting display device may be improved.

It should be noted that, although the above first to third embodiments are separately described, it is apparent for the person skilled in the art that the first to third embodiments may be combined with each other. In other words, two or more of grooves disclosed in the first to third embodiments may be simultaneously formed.

Although the grooves as an example is described above, the present invention may also use any other passage capable of discharging the out-gas, for example holes.

Furthermore, although the organic light-emitting display device as an example is described above, the present invention may also be applied to other light-emitting display device including an adhesive layer.

Although the aspects of the present disclosure have been described above in detail with reference to the accompanying drawings, it will be apparent to those skilled in the art that the present disclosure described above is not limited to the aspects described above, and various substitutions, modifications, and alterations may be devised within the spirit and scope of the present disclosure. Accordingly, various aspects disclosed in the present disclosure are not intended to limit the technical sprit of the present disclosure, and the scope of the technical sprit of the present disclosure is not limited by the aspects. Accordingly, the disclosed aspects are provided for the purpose of description and are not intended to limit the technical scope of the disclosure, and the technical scope of the disclosure is not limited by the aspects. The range of the disclosure should be interpreted based on the following claims, and all technical ideas that fall within the range equivalent to the claims should be understood as belonging to the scope of the disclosure.

What is claimed is:

1. An organic light-emitting display device having a display area and a non-display area surrounding the display area, the organic light-emitting display device comprising:
a thin-film transistor array including a plurality of thin-film transistors and a lower pad portion located in the display area and the non-display area, respectively;
an organic light-emitting array located on the thin-film transistor array;
a touch electrode array including a plurality of touch electrodes located in the display area, an upper pad portion including a plurality of upper pads located in the non-display area, and a plurality of touch routing lines connecting between the plurality touch electrodes and the plurality of upper pads;

an adhesive layer located between the organic light-emitting array and the touch electrode array and bonding the organic light-emitting array and the touch electrode array; and
a seal material including a plurality of conductive balls and bonding the upper pad portion and the lower pad portion in the non-display area, one side of the seal material being in contact with the adhesive layer,
wherein the thin-film transistor array includes at least one groove located in an area that corresponds to a boundary between the seal material and the adhesive layer, and
wherein the adhesive layer includes a first portion directly bonded to the seal material in the non-display area and a second portion extended from the first portion to the display area to bond the organic light-emitting array and the touch electrode array, and
wherein the at least one groove is covered with the seal material and the adhesive layer and overlaps at least some of the plurality of touch routing lines.

2. The device according to claim 1, wherein the at least one groove has a major axis in parallel with a horizontal direction of the organic light-emitting display device.

3. The device according to claim 2, wherein the major axis of the at least one groove has a length equal to or greater than a length of the seal material in the horizontal direction.

4. The device according to claim 3, wherein at least one end of the at least one groove protrudes toward an outer periphery of the seal material and the adhesive layer.

5. The device according to claim 4, wherein at least one end of the at least one groove is covered with the seal material and the adhesive layer protrudes to the outer periphery of the seal material and the adhesive layer.

6. The device according to claim 1, wherein the lower pad portion includes a plurality of lower pad electrodes spaced apart from each other, and
wherein the at least one groove extends from the boundary between the seal material and the adhesive layer in the lower pad portion to an outer periphery of the lower pad portion through a gap between the lower pad electrodes.

7. The device according to claim 6, wherein one end of the at least one groove is located in the outer periphery of the lower pad portion and is covered with the seal material.

8. The device according to claim 6, wherein one end of the at least one groove is located in the outer periphery of the lower pad portion and protrudes to an outer periphery of an area in which the seal material is formed.

9. The device according to claim 1, further comprising:
a lower substrate in which the display area and the non-display area are defined; and
a first buffer layer located on the lower substrate,
wherein the thin-film transistor array includes a gate insulation layer disposed on the first buffer layer, at least one lower interlayer insulation layer disposed on the gate insulation layer, and a lower passivation layer disposed on the lower interlayer insulation layer, and
wherein the groove is formed by removing at least one of the first buffer layer, the gate insulation layer, the at least one lower interlayer insulation layer, or the lower passivation layer.

10. The device according to claim 1, wherein the at least one groove penetrates the thin-film transistor array to expose the adhesive layer to an outside.

11. An organic light-emitting display device in which a display area and a non-display area around the display area are defined, the organic light-emitting display device comprising:
a thin-film transistor array including a plurality of thin-film transistors and a lower pad portion located in the display area and the non-display area, respectively;
an organic light-emitting array located on the thin-film transistor array;
a touch electrode array including a plurality of touch electrodes located in the display area, an upper pad portion including a plurality of upper pads located in the non-display area, and a plurality of touch routing lines connecting between the plurality touch electrodes and the plurality of upper pads;
an adhesive layer bonding the organic light-emitting array and the touch electrode array; and
a seal material including a plurality of conductive balls and bonding the upper pad portion and the lower pad portion in the non-display area,
wherein the touch electrode array includes a plurality of grooves respectively located between the plurality of touch routing lines at a boundary between the adhesive layer and the seal material,
wherein the plurality of grooves penetrates the touch electrode array to expose the adhesive layer and the seal material to an outside, and
wherein the adhesive layer includes a first portion directly bonded to the seal material in the non-display area and a second portion extended from the first portion to the display area to bond the organic light-emitting array and the touch electrode array.

12. The device according to claim 11, further comprising:
an upper substrate in which the display area and the non-display area are defined; and
a second buffer layer located on an entire surface of the upper substrate,
wherein the touch electrode array includes at least one upper interlayer insulation layer disposed under the second buffer layer and an upper passivation layer disposed under the upper interlayer insulation layer, and
wherein the plurality of grooves is formed by removing at least one of the second buffer layer, the upper interlayer insulation layer, or the upper passivation layer.

13. An organic light-emitting display device where a display area and a non-display area surrounding the display area are defined thereon, comprising:
a thin-film transistor array including a plurality of thin-film transistors and a lower pad portion, respectively located in the display area and the non-display area;
an organic light-emitting array located on the thin-film transistor array;
a touch electrode array including a plurality of touch electrodes located in the display area and an upper pad portion including a plurality of upper pads located in the non-display area, and a plurality of touch routing lines connecting between the plurality touch electrodes and the plurality of upper pads;
an adhesive layer bonding the organic light-emitting array and the touch electrode array; and
a seal material attaching the upper pad portion with the lower pad portion in the non-display area,
wherein the thin-film transistor array or the touch electrode array includes at least one groove in close proximity to the adhesive layer to act as a path for outgassing from the adhesive layer to outside the organic light-emitting display device, and wherein the adhesive layer includes a first portion directly bonded to the seal material in the non-display area and a second portion extended from the first portion to the display area to bond the organic light-emitting array and the touch electrode array, and wherein the at least one groove is covered with the seal material and the adhesive layer and overlaps at least some of the plurality of touch routing lines.

14. The device according to claim 13, wherein the at least one groove has a major axis in parallel with a horizontal direction of the organic light-emitting display device.

15. The device according to claim 14, wherein the major axis of the at least one groove has a length equal to or greater than a length of the seal material in the horizontal direction.

16. The device according to claim 15, wherein at least one end of the at least one groove protrudes toward an outer periphery of the seal material and the adhesive layer.

17. The device according to claim 13, wherein the lower pad portion includes a plurality of lower pad electrodes spaced apart from each other.

18. The device according to claim 13, wherein the at least one groove extends from the in close proximity to the adhesive layer in the lower pad portion to an outer periphery of the lower pad portion through a gap between the lower pad electrodes.

19. The device according to claim 1, wherein the plurality of touch routing lines include at least first portions of a first direction and second portions of a second direction, and wherein the at least one groove overlaps the first portions and the second portions of the plurality of touch routing lines.

20. The device according to claim 1, wherein the at least one groove includes:
at least one first groove overlapping at least one first portion of a first direction among the plurality of touch routing lines, and
at least one second groove overlapping at least one first portion of the first direction and at least one second portion of a second direction among the plurality of touch routing lines.

* * * * *